United States Patent
Hara et al.

(10) Patent No.: US 7,212,274 B2
(45) Date of Patent: May 1, 2007

(54) COOLING SYSTEM, EXPOSURE APPARATUS HAVING THE SAME, AND DEVICE MANUFACTURING METHOD

(75) Inventors: Shinichi Hara, Kanagawa-ken (JP); Hideo Yokota, Kanagawa-ken (JP)

(73) Assignee: Canon Kabushiki Kaisha, Tokyo (JP)

(*) Notice: Subject to any disclaimer, the term of this patent is extended or adjusted under 35 U.S.C. 154(b) by 45 days.

(21) Appl. No.: 10/953,205

(22) Filed: Sep. 29, 2004

(65) Prior Publication Data

US 2005/0110967 A1 May 26, 2005

(30) Foreign Application Priority Data

Sep. 30, 2003 (JP) .............................. 2003-340790

(51) Int. Cl.
*G03B 27/52* (2006.01)

(52) U.S. Cl. ............................. 355/30; 355/67; 355/71

(58) Field of Classification Search .................. 355/30, 355/67, 71
See application file for complete search history.

(56) References Cited

U.S. PATENT DOCUMENTS

| | | | | |
|---|---|---|---|---|
| 4,422,725 A | * | 12/1983 | Prewo | .......................... 359/846 |
| 4,825,247 A | * | 4/1989 | Kemi et al. | ..................... 355/53 |
| 5,754,275 A | * | 5/1998 | Takeda | ......................... 355/30 |
| 5,813,233 A | | 9/1998 | Okuda et al. | |
| 6,000,227 A | | 12/1999 | Kroeker | |
| 6,098,408 A | | 8/2000 | Levinson et al. | |
| 6,298,669 B1 | | 10/2001 | Maruyama et al. | |
| 6,359,678 B1 | | 3/2002 | Ota | |
| 6,846,086 B2 | * | 1/2005 | Goldstein | .................... 359/846 |
| 2002/0027644 A1 | | 3/2002 | Bisschops | |
| 2004/0165161 A1 | | 8/2004 | Hara | |
| 2004/0174504 A1 | | 9/2004 | Hara et al. | |
| 2004/0200226 A1 | | 10/2004 | Hara | |
| 2004/0218160 A1 | | 11/2004 | Hara | |
| 2004/0227914 A1 | | 11/2004 | Hara | |
| 2004/0227920 A1 | | 11/2004 | Hara | |
| 2005/0073663 A1 | * | 4/2005 | Miyajima | .................... 355/30 |

FOREIGN PATENT DOCUMENTS

| | | |
|---|---|---|
| EP | 1 318 431 A1 | 6/2003 |
| JP | 2000-98092 | 4/2000 |
| JP | 2003-68626 | 3/2003 |

OTHER PUBLICATIONS

European Search Report dated Jul. 14, 2005.
European Patent Office-Communication dated Jul. 28, 2005.

\* cited by examiner

*Primary Examiner*—D. Rutledge
(74) *Attorney, Agent, or Firm*—Morgan & Finnegan, L.L.P.

(57) ABSTRACT

Disclosed is cooling technology in one aspect of which is a cooling system for cooling an optical member including a material having a linear expansion coefficient that becomes equal to zero at a predetermined temperature, the cooling system including a temperature detecting unit for detecting a temperature of a detection-subject portion of the optical member, a cooling unit for cooling a cooling-subject portion of the optical member, and a control unit for controlling the cooling unit on the basis of the detection by the temperature detecting unit.

15 Claims, 9 Drawing Sheets

COOLING SYSTEM, EXPOSURE APPARATUS HAVING THE SAME, AND DEVICE MANUFACTURING METHOD

FIELD OF THE INVENTION AND RELATED ART

This invention relates generally to a cooling technology. More particularly, the invention concerns a cooling system for cooling an optical element used in an exposure apparatus for exposing a workpiece to be processed such as a monocrystal substrate for semiconductor wafer or a glass substrate for liquid crystal display, for example. Specifically, the present invention is suitably usable as a cooling system for cooling an optical element of an exposure apparatus that uses ultraviolet light or extreme ultraviolet (EUV) light as an exposure light source.

For production of fine semiconductor devices such as semiconductor memories or logic circuits based on photolithography (printing) technology, reduction projection exposure apparatuses for projecting and transferring a circuit pattern, formed on a reticle or mask (these words are used interchangeably in this specification), onto a wafer or the like through a projection optical system, are used.

The smallest size (resolution) that can be transferred by the reduction projection exposure apparatus is proportional to the wavelength of light used for the exposure, and it is inversely proportional to the numerical aperture (NA) of the projection optical system. Thus, the shorter the wavelength is, the higher the resolution is. In consideration of this, the wavelength of exposure light has been shorted more and more to meet recent requirements for further miniaturization of a semiconductor chip. Actually, the wavelength of ultraviolet light used has been shortened from ultra high pressure Hg lamp (i-line of a wavelength of about 365 nm), to KrF excimer laser (wavelength is about 248 nm) and to ArF excimer laser (wavelength is about 193 nm).

However, semiconductor devices are becoming finer and finer, and the lithography using ultraviolet light practically has a limit. In consideration of this, for efficient transfer of a very fine circuit pattern of 0.1 µm or narrower, reduction projection exposure apparatuses which use extreme ultraviolet (EUV) light of a wavelength of about 10 nm to 15 nm, much shorter than that of ultraviolet light, are being developed. Hereinafter, such apparatus will be referred to as EUV exposure apparatus.

As the wavelength of exposure light becomes shorter, absorption of light by a substance becomes very large. It becomes therefore difficult to use refractive elements based on refraction of light (i.e., lenses) such as those used with visible light or ultraviolet light. Furthermore, there is no available glass material that can be used in the wavelength region of EUV light. For these reasons, a reflection type optical system in which an optical system is constituted only by reflective elements based on reflection of light, that is, mirrors (e.g., multilayered mirrors), is used.

The mirror for EUV light does not reflect all the exposure light, but 30% or more of the exposure light is absorbed by the mirror. The absorbed exposure light is transformed into heat which causes deformation of the mirror surface shape, thus causing degradation of the optical performance (particularly, imaging performance). Japanese Laid-Open Patent Application, Publication No. 2000-98092 discloses a structure for suppressing deformation of an optical element such a mirror, wherein, as a base material of the mirror, a material (invar, for example) of low thermal expansion coefficient having small linear expansion coefficient (for example, linear expansion coefficient of 5 ppb), is used.

Since however the EUV exposure apparatus is used for exposure of a circuit pattern of 0.1 µm or narrower, the required linewidth precision is extraordinarily strict, and deformation of only about 0.1 nm is allowed in regard to the mirror surface shape.

Therefore, even if the linear expansion coefficient of the mirror is 5 ppb, as the temperature rises gradually, the mirror surface shape changes. If the mirror has a thickness 50 mm, a temperature rise of 0.1° C. causes deformation of 0.1 nm in the mirror surface shape.

SUMMARY OF THE INVENTION

It is accordingly an object of the present invention to provide a cooling technique for reducing thermal deformation of an optical member, to thereby assure desired optical performance.

In accordance with an aspect of the present invention, to achieve above-described object, there is provided a cooling system for cooling an optical member including a material having a linear expansion coefficient that becomes equal to zero at a predetermined temperature, said cooling system comprising: a temperature detecting unit for detecting a temperature of a detection-subject portion of the optical member; a cooling unit for cooling a cooling-subject portion of the optical member; and a control unit for controlling said cooling unit on the basis of the detection by said temperature detecting unit.

In accordance with another aspect of the present invention, there is provided an exposure apparatus, comprising: an optical system for exposing an object to a pattern of an original; a temperature detecting unit for detecting a temperature of a detection-subject portion of an optical member of said optical system, the optical member including a material having a linear expansion coefficient that becomes equal to zero at a predetermined temperature; a cooling unit for cooling a cooling-subject portion of the optical member; and a control unit for controlling said cooling unit on the basis of the detection by said temperature detecting unit.

In accordance with a further aspect of the present invention, there is provided a device manufacturing method, comprising the steps of: exposing a substrate to a pattern of an original by use of an exposure apparatus; and developing the exposed substrate, wherein the exposure apparatus includes (i) an optical system for exposing an object to a pattern of an original, (ii) a temperature detecting unit for detecting a temperature of a detection-subject portion of an optical member of the optical system, the optical member including a material having a linear expansion coefficient that becomes equal to zero at a predetermined temperature, (iii) a cooling unit for cooling a cooling-subject portion of the optical member, and (iv) a control unit for controlling the cooling unit on the basis of the detection by the temperature detecting unit.

In accordance with a yet further aspect of the present invention, there is provided a cooling method for cooling an optical member including a material having a linear expansion coefficient that becomes equal to zero at a predetermined temperature, said method comprising the steps of: detecting a temperature of a detection-subject portion of the optical member; and cooling a cooling-subject portion of the optical member on the basis of the detection at said detecting step.

In accordance with the cooling technology of the present invention, thermal deformation of an optical member can be reduced and a desired optical performance is assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 4:
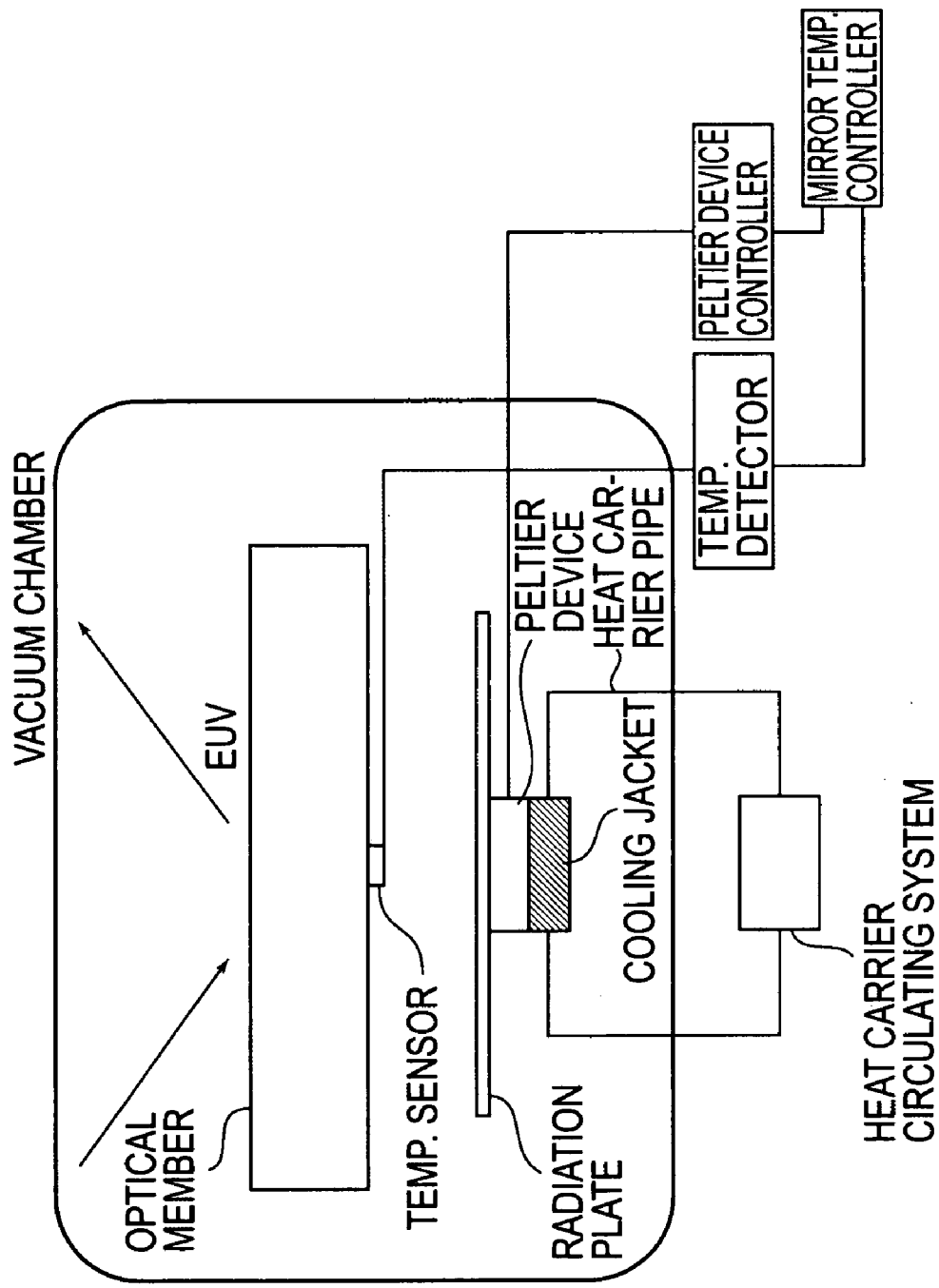
FIG. 4 is a schematic and diagrammatic view of an exposure apparatus having a mechanism for cooling a mirror made of a base material having a constant linear expansion coefficient.

FIG. 4 is a schematic view of an exposure apparatus having a mechanism for cooling a mirror having a base material of approximately constant linear expansion coefficient. As shown in this drawing, a case is now considered wherein the temperature of a mirror having a base material consisting of a material having small linear expansion coefficient is kept constant by means of radiation temperature adjustment (namely, the temperature of the mirror adjusted, preferably cooled, without contact thereto). There is a single temperature sensor joined to the back surface of the mirror, for detecting the mirror temperature. The temperature of a radiation plate is adjusted so that the mirror temperature as detected by the temperature sensor is maintained constant.

The radiation plate is temperature controlled by joining thereto a Peltier device. The temperature at the top face of the Peltier device is controlled in the manner that an output to be applied to a Peltier device controller is determined by PID control on the basis of the result of comparison between the detected mirror temperature and a target (desired) temperature and of the temperature at the bottom face of the Peltier device. At the bottom face of the Peltier device, a heat carrier (medium) is circulated through a cooling jacket so as to carry away the heat produced by heat generation of the Peltier device itself as well as the heat absorbed by the mirror.

By keeping the mirror temperature constant in the manner described above, a change in the mirror surface shape is reduced.

However, since the linear expansion coefficient of the mirror material is constant, a change of the mirror surface shape is largely attributable to temperature distribution of the mirror, rather than to temperature change of the whole mirror. Namely, where the linear expansion coefficient of the mirror material is substantially constant within the range of temperature change, temperature distribution of the mirror applies more influence to the mirror surface shape, than the temperature change of the whole mirror does.

Figure 6A:
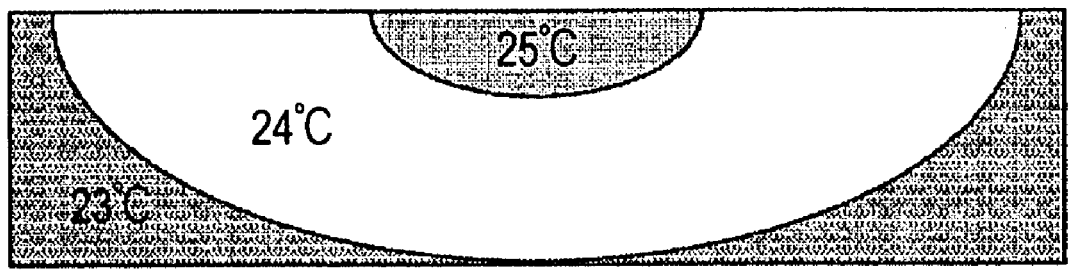
FIGS. 6A and 6B illustrate specific examples of temperature distribution.
Figure 6B:
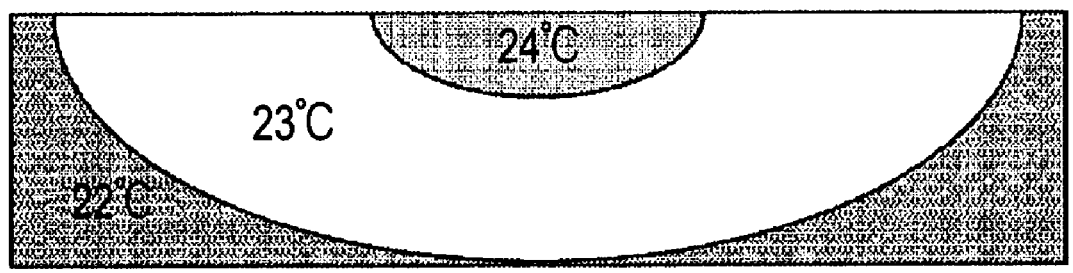

More specifically, when a mirror was formed by using a material having a constant linear expansion coefficient regardless of the temperature as conventional, there was no significant difference in the change of mirror surface shape between a case of temperature distribution shown in FIG. 6A and a case of temperature distribution shown in FIG. 6B (distribution was the same as the FIG. 6A case but the temperature of the whole was lower by one degree).

Figure 5:
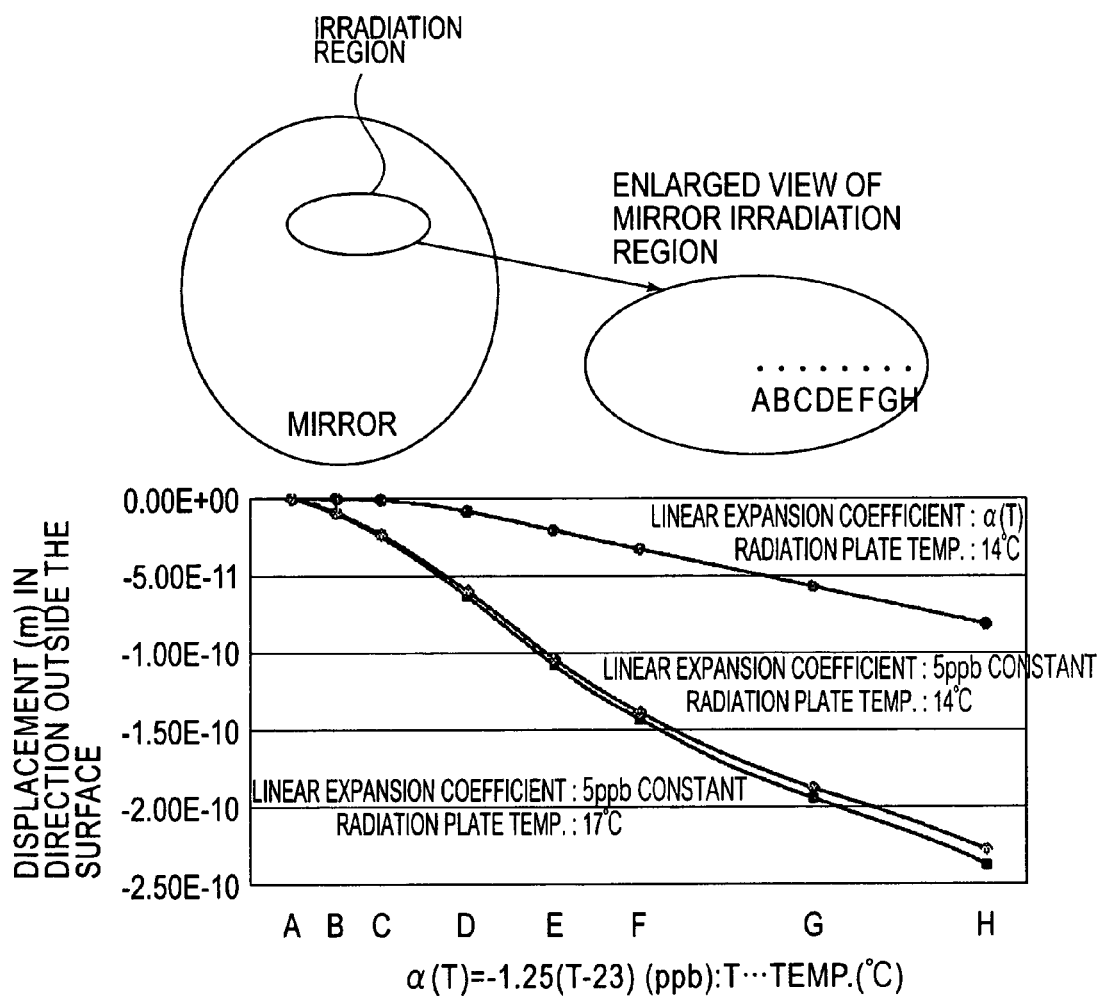
FIG. 5 is a graph for explaining displacement of a mirror surface in an outward direction off the surface.

FIG. 5 is illustrates differences in displacement of the mirror in a direction outside the mirror surface, in various cases of mirror base material linear expansion coefficients and radiation plate temperatures. The graph of FIG. 5 shows a case where the linear expansion coefficient of the mirror material is approximately constant regardless of the temperature, and a case where the linear expansion coefficient α can be expressed as a function of the temperature T (° C.) as by:

$$\alpha(T) = -1.25(T-23)(\text{ppb})$$

(namely, a case where a material whose linear expansion coefficient becomes substantially equal to zero at a target temperature, that is, 23 deg.). This is a graph illustrating differences in the change of mirror surface shape, within a region of the mirror top surface irradiated by the exposure light, caused by absorption of exposure light. More specifically, it is a graph showing differences in displacement, in the direction outside the surface, at eight points (points A-H) inside the region irradiated by the exposure light, when the point A is taken as a reference. Here, it is not necessary that the target temperature is 23° C., and it may be any level if it is within the range of 23±0.5° C. Preferably, it should be within the range of 23±0.1° C.

It is seen from FIG. 5 that, where the linear expansion coefficient α is such a function of the temperature T that an absolute value of the linear expansion coefficient becomes substantially equal to zero at a target temperature 23° C., by cooling the mirror with use of a radiation plate or the like to make the average temperature of the mirror close to about 23 degree (23±0.5° C., preferably, 23±0.1° C.), the linear expansion coefficient of the mirror material can be made small (because the thermal expansion of the mirror can be made small), and therefore displacement of the mirror in a direction outside the surface can be made very small.

Namely, in a projection optical system and an exposure apparatus of this embodiment, a mirror whose base material consists of a material having a linear expansion coefficient which becomes equal to zero at a target temperature (23±1 deg. in this example) or it error range (about 1 deg.) is used, and the mirror is cooled by use of a radiation member such as a radiation plate, for example, by which intended reduction of mirror deformation amount can be accomplished.

In order to compensate for a change in optical characteristic due to deformation of the mirror resulting from absorption of exposure light, a driving mechanism for partially deforming the mirror in a direction outside the surface or a driving mechanism (spacing adjusting mechanism) for moving an optical member to adjust the spacing between adjacent optical members, may be provided separately. Here, is such driving mechanism is used, it is desirable to adjust the spacing substantially in the optical axis direction of the optical members or to move the optical member substantially in the optical axis direction. More specifically, the exposure apparatus in which a cooling system of this embodiment is incorporated includes a plurality of optical elements (preferably mirrors, and preferably of a number of four, six or eight) disposed along an optical axis and inside a projection optical system (optical system provided between a reticle and a wafer), and at least one of the optical elements should desirably be moved in the optical axis direction.

Here, the term "optical axis" defined here refers to a straight line that connects curvature centers of the optical surfaces (reflection surface in the case of a mirror, and transmission surface in the case of a lens) of the optical elements of the exposure apparatus. As a matter of course, if the optical elements are eccentrically adjusted for the purpose of optical characteristic adjustment, there may be cases wherein the curvature centers of these optical elements slightly deviate from the aforementioned optical axis. Thus, the term "optical axis" referred to here is defined as a straight line that substantially connects curvature centers of optical surfaces of plural optical elements.

Next, referring to the drawings, preferred embodiments of cooling system, cooling method, projection optical system using such cooling system, exposure apparatus, and device manufacturing method will be described. In the drawings, corresponding elements are denoted by like numerals, and duplicate description will be omitted.

Embodiment 1

Figure 1:
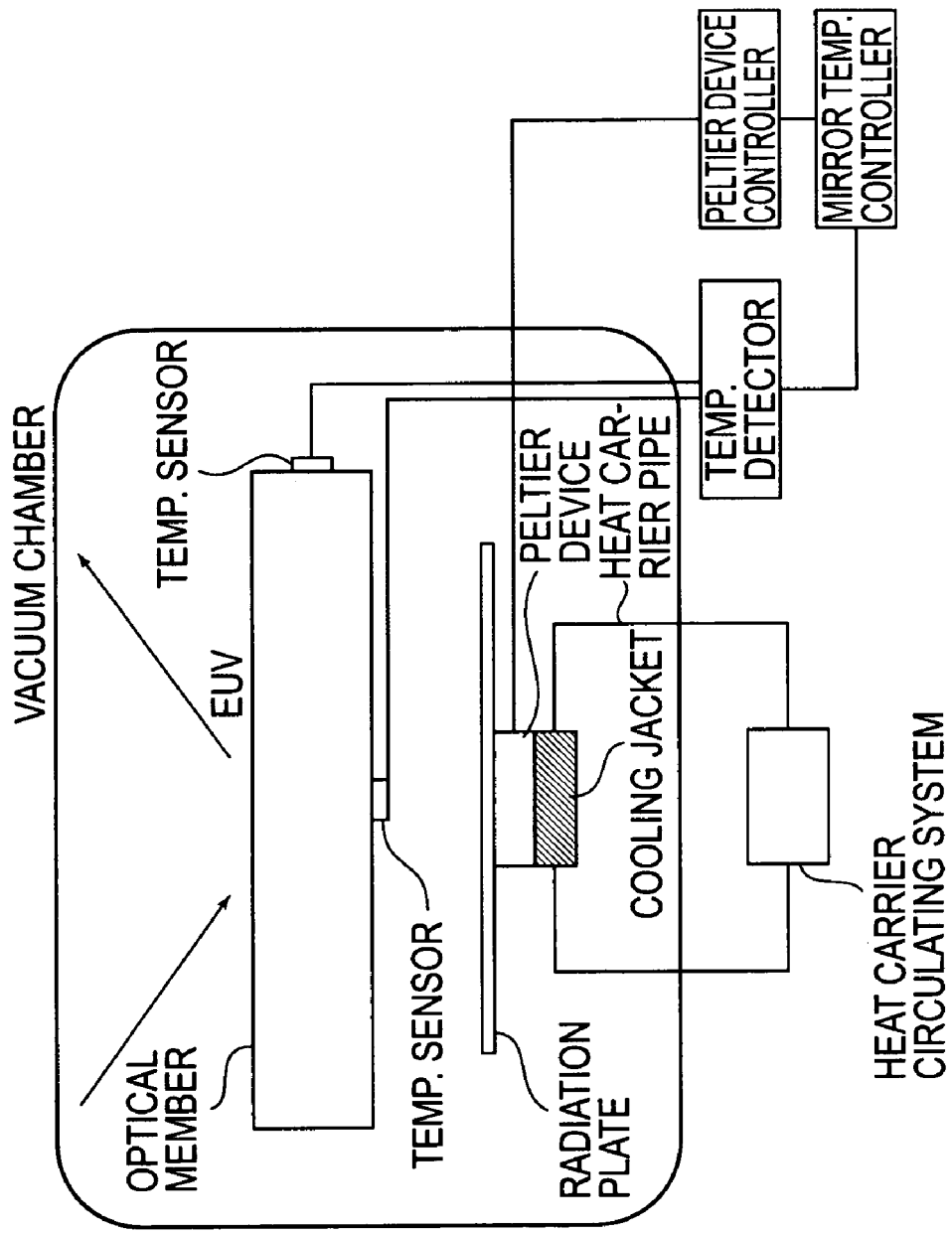
FIG. 1 is a schematic and diagrammatic view of a cooling system according to a first embodiment of the present invention.

FIG. 1 is a schematic view of a general structure of a cooling system 1 according to an aspect of the present invention.

The cooling system 1 is an apparatus for cooling an optical member disposed in a vacuum chamber. The inside of the chamber is filled with a vacuum ambience of a pressure not greater than 10E-4 Pa, and preferably not greater than 10E-6 Pa. In order to prevent adhesion of contaminants to the surface of the optical member due to reaction between exposure light and any high polymer organic gas components remaining in the chamber, the inside the vacuum chamber is maintained at a vacuum of about 1×10-6 [Pa] by means of a pump, not shown. Inside the vacuum chamber, the optical member is positioned at a predetermined position through a supporting member, not shown, and it functions to image the light on the basis of reflection, refraction and diffraction, for example. The optical member may include mirror, lens, plane parallel plate, prism, or diffractive optical element (including reflection type diffractive optical element) such as Fresnel zone plate, kinoform, binary optics, and hologram, for example.

The optical member shown in FIG. 1 has a base material which consists of a material having a linear expansion coefficient being variable with temperature, wherein there is a temperature whereat the linear expansion coefficient becomes equal to zero. Here, the base material refers to a material whose weight occupies more than 50% (preferably 80%) of the total weight of the optical member. In this embodiment, description will be made on an example wherein the optical member is a mirror. Further, although the temperature whereat the linear expansion coefficient becomes equal to zero is 23° C. in this example, this temperature 23° C. is a target temperature in this embodiment. The target temperature refers to a temperature of final output value (mirror temperature) where a cooling system or the like is controlled, and a cooling member (radiation plate or the like) within the cooling system is controlled so that the temperature of the subject of cooling, such as a mirror, comes to the target temperature 23° C.

Although in the following example the target temperature of the mirror (subject of cooling) is 23° C. and the linear expansion coefficient of the mirror base material becomes equal to zero at 23° C., the target temperature may be different from 23° C. and the temperature whereat the linear expansion coefficient becomes zero is not just 23° C. but it may be shifted by about plus or minus 1 deg. Namely, the target temperature of the subject of cooling is merely illustratively 23° C., and it may be any other temperature. The linear expansion coefficient may become zero just at the target temperature, but the temperature may be anywhere within the range of target temperature ±1 deg. Preferably, however, the target temperature and the temperature whereat the linear expansion coefficient becomes equal to zero is substantially are registered with each other (with an error of not more than 0.1 deg.).

The cooling system of FIG. 1 includes a temperature detecting device and a mirror temperature controlling device. The mirror temperature detecting device is arranged so that the temperature or temperature distribution of the optical member whose temperature increases with irradiation with exposure light (EUV light in this example) is detected by use of a single temperature sensor or a plurality of temperature sensors, which is or are provided to detect the temperature at a single or plural locations on the optical member. The temperature of the optical member becomes higher in an irradiated region as a result of irradiation with EUV light, but it is low in a non-irradiated region. Thus, a temperature distribution is produced. The temperature sensor or sensors are arranged to detect the temperature at a single location or plural locations (at the top and bottom surfaces in the latter case) on the optical member to thereby detect the temperature of a predetermined portion of the optical member, or the temperature distribution thereof. The temperature detecting device outputs and applies the detected temperature of the optical member to the mirror temperature controller to be described later. The temperature sensor may comprise thermocouple, resistance temperature sensor, infrared temperature sensor, for example. While in this embodiment the temperature sensor is attached (contacted) to the optical member, the temperature of the optical member may be detected without contact to the optical member.

The mirror temperature controlling device is operable to decrease the temperature of a radiation plate, joined to the top face of the Peltier device, thereby to lowers the mirror temperature on the basis of radiation cooling, and on the other hand to increase the temperature of the radiation plate thereby to raise the mirror temperature on the basis of radiation heating.

For example, the heat quantity that a substance Y having an absolute temperature T2 [K] and an area A2 [m2] absorbs from a substance X having an absolute temperature T1 [K] and an area A1 [m2] can be expressed, where the radiation coefficient of the substance X is E1, the radiation coefficient of the substance Y is E2, and the radiation geometric factor (the rate of the energy that reaches the substance Y to the energy emitted from the substance X) is F12, by using heat flux density Q [W/m2] as an equation such as follows (where T1>T2):

$$Q=5.67\times10-8\times(T1^4-T2^4)/((1-E1)/(E1\times A1)+(1/(A2\times F12))+(1-E2)/(E2\times A2))$$

where 5.67×10−8 is Stefan-Boltzmann constant.

As regards the radiation plate, a member of SiC or Si having high radiation coefficient and good heat conductivity and having a surface coated with SiO2 may be used. Since the radiation plate is fixed with a spacing kept to the optical member, unwanted transmission of vibration of the radiation plate (including Peltier device, cooling jacket and heat carrier pipes) to the optical member can be effectively prevented. As a result, vibration of optical member due to external vibration is avoided, and desired optical performance is assured.

The temperature of the radiation plate can be changed by the Peltier device joined thereto. The Peltier device may comprise, for example, p-type and n-type semiconductors disposed thermally in parallel. The Peltier device is controlled by a Peltier device controller to be described later, and it is joined to the radiation plate to cool the same by Peltier effect. Here, the "Peltier effect" refers to a phenomenon that, when an electric current is applied to a contact point between different types of conductors or semiconductors, transfer of heat occurs due to the difference in electric conductivity. In this embodiment, the Peltier device is provided by p-type and n-type semiconductors, and in the region from the p-type semiconductor to the n-type semiconductor, since electrons are difficult to flow, a heat absorbing plane is defined there, whereas in the region from the n-type semiconductor to the p-type semiconductor, since electrons can easily flow, a heat radiating plane is defined there. Thus, by joining the heat absorbing plane (top face) of the Peltier device to the radiation plate, heat can be absorbed from the radiation plate and thus the radiation plate can be cooled thereby. On the other hand, the temperature of the Peltier device can be adjusted by an applied voltage. Also, it can be heated by applying a reverse voltage thereto. Since the Peltier device has good response, it is possible to control the temperature of the radiation plate precisely to maintain the temperature of the optical member at a predetermined level. The Peltier device temperature controller performs the control of Peltier device surface temperature, by changing the voltage applied to the Peltier device.

A cooling jacket is joined to the heat radiating surface (bottom face) of the Peltier device. On the basis of convective heat transfer with the heat carrier flowing through the cooling jacket, the heat produced by exposure energy absorbed by the optical member as well as the heat produced by heat generation within the Peltier device itself are collected. The heat carrier is temperature controlled at a constant temperature by means of a heat carrier circulating system, and after that it is supplied and circulated through heat carrier pipes. In this embodiment, as the heat carrier medium, water (liquid) is supplied and circulated. In plate of it, a gas having relatively large heat conductivity such as helium may be used.

In the cooling system of the structure such as described above, the mirror temperature controller detects the temperature distribution of the mirror on the basis of signals from the temperature sensor which detects the temperature at two (or more) locations upon the mirror which is the subject of cooling. Then, on the basis of the detected temperature distribution, it cools a predetermined portion of the mirror so that deformation at the mirror bottom face side (inside the light-projected region of the mirror) is suppressed within an allowable range (preferably, reduced to minimum).

For example, it is assumed that the temperatures at the lower surface (bottom face) and the side surface of the mirror are measured and, for example, the lower surface temperature is 24° C. and side surface temperature is 23.5° C. If there is a temperature difference of 0.5° C. between the lower surface temperature and the side surface temperature as in this example, those temperatures at mirror portions with which the amount of deformation of the mirror surface can be held within an allowable range are derived from a numerical table (a table that represents the relationship between the temperature distribution and the temperatures of mirror portions with which the amount of deformation of the mirror surface can be held within an allowable range while still keeping the temperature distribution), having been prepared beforehand on the basis of measurement (actually measured values) or simulations and having been memorized in the system.

Here, if it is concluded that at the lower surface temperature 23° C. and the side surface temperature 22.5° C. the change in surface shape of the mirror takes a value (minimum value) within the allowable range (where the linear expansion coefficient α of the mirror is the function a of the temperature T (° C.), that is, α(T)=−1.25(T−23) (ppb)), then the temperature controller applies a signal to the Peltier device controller so as to adjust the mirror lower surface temperature to 23° C.

Here, it is desirable that the table include temperature information related to the mirror portion or portions (subject of detection) with respect to which the temperature detection is carried out, and also it is desirable that the cooling system includes separate cooling mechanisms for cooling these detection-subject mirror portions independently from each other.

With the operation of the mirror temperature control device as described above, the change in shape of the irradiated surface of the mirror due to absorption of exposure light can be suppressed to a very low level.

Here, the manner of cooling the optical member using this cooling system will be explained.

First, the temperature detecting device detects the temperature at two (or more) locations on the optical member, and applies a temperature signal to the mirror temperature controller. By using the numerical table and on the basis of the detected temperatures at two (or more) locations of the optical member, the mirror temperature controller derives an optimum mirror lower surface temperature with which a change of the mirror surface shape from its initial shape becomes minimum. Then, the mirror temperature controller applies a signal to the Peltier device controller so that the signal from the mirror lower surface temperature sensor is registered with the temperature derived in the manner described above. Then, on the basis of a difference between (i) temperature data obtained through the temperature detecting device by detecting the signal from the mirror lower surface temperature sensor and (ii) the mirror surface temperature as derived by the mirror temperature controller, the Peltier device controller controls the voltage to be applied to the Peltier device through PID control, for example. By this, the mirror lower surface temperature can be controlled to a desired temperature. The above-described procedure is repeated while the optical member is irradiated with exposure light.

Alternatively, if the exposure light irradiated to the mirror and heat transfer from the mirror are constant and the temperature at a predetermined portion of the mirror is known, and where the temperature distribution of the mirror can be presumed correctly, the temperature detecting device may be arranged to detect the temperature at a single location.

In accordance with the cooling system and cooling method described above, even for an optical member disposed in a vacuum ambience, it is possible to cool the optical member without contact thereto and, also, to reduce the amount of thermal deformation of the exposure-light irradiated surface of the mirror (a portion of the front surface side). Therefore, deformation of the optical member due to thermal expansion, which directly causes degradation of the imaging performance, can be reduced effectively, and desired optical performance can be assured.

In the first embodiment described above, temperatures at two (or more) locations on the optical member are detected and, on the basis of the temperature difference, a target temperature (a temperature of control target) of a detection-subject portion (a portion of the optical member to be temperature-detected) or of a cooling-subject portion (a portion of the optical member to be cooled by a cooling mechanism) is derived. However, the temperature difference at the detection-subject portion may not always be registered with the temperature difference after the temperature adjustment (after the mirror temperature adjustment made to hold the change of the mirror surface shape within an allowable range). In consideration of this, preferably, the target temperature of the detection-subject portion or of the cooling-subject portion may be derived on the basis of both of the temperature at the detection-subject portion and the temperature difference at the two locations.

Furthermore, where a reflective optical member is the subject of cooling, the surface temperature of the reflective optical member may be controlled to a temperature whereat the linear expansion coefficient becomes equal to zero. Alternatively, an average temperature of the reflective optical member may be controlled to a temperature whereat the linear expansion coefficient becomes equal to zero.

In this embodiment, the base material of the optical member consists of a material having a temperature at which the linear expansion coefficient becomes equal to zero. That is, the optical member is provided by such material that has a temperature at which the linear expansion coefficient becomes equal to zero, and a multilayered film is formed thereon. As an alternative, a material having a temperature at which the linear expansion coefficient becomes equal to zero and a material having small linear expansion coefficient may be used in combination as the base material of the optical member.

Embodiment 2

Figure 2:
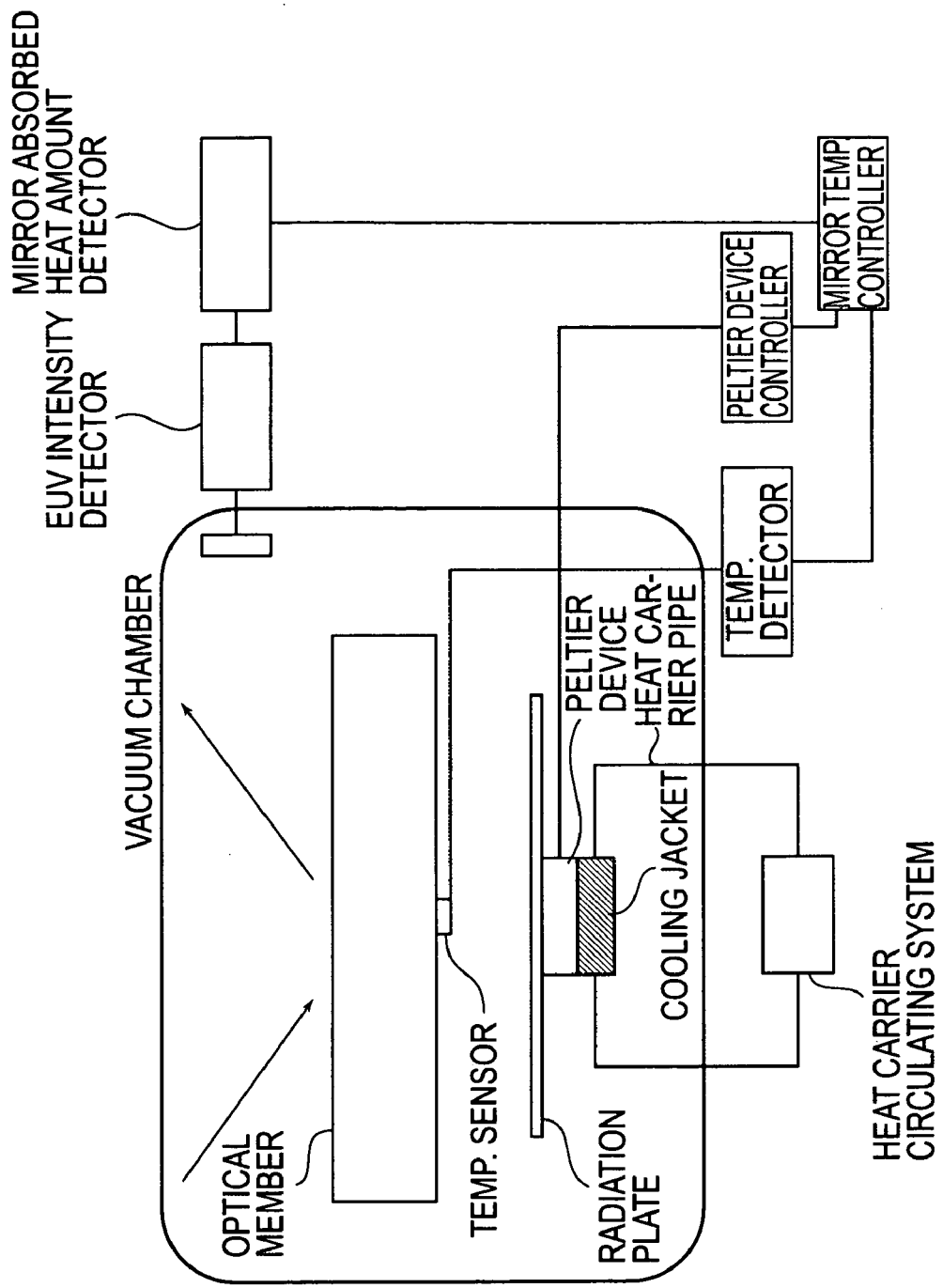
FIG. 2 is a schematic and diagrammatic view of a cooling system according to a second embodiment of the present invention.

Next, referring to FIG. 2, a cooling system of a second embodiment of the present invention, corresponding to a modified form of the above-described cooling system, will be explained. Those portions not described below have a corresponding structure and operation as of the first embodiment.

As compared with the cooling system of the first embodiment (FIG. 1), the cooling system of the second embodiment includes an EUV intensity detecting device for detecting the intensity of EUV light (exposure light), and a mirror absorption heat quantity detecting device for detecting the heat quantity as absorbed by the mirror in response to EUV irradiation on the basis of a detected value of the intensity detector.

The EUV intensity detector may detect the EUV intensity at anywhere. In dependence upon the structure from the detection position to the mirror, if attenuation of light intensity by the mirror reflection and attenuation of light intensity by passage of light through an air are known, the heat quantity absorbed by each mirror can be calculated by the mirror absorption heat quantity detecting device. If, for example, the EUV light intensity at a position on the wafer surface is 0.1 W and the vacuum level is high and attenuation of EUV in the air can be disregarded and where the mirror reflectance is 0.65 (mirror absorptance is 0.35), the EUV absorption heat quantity at a mirror just upstream of the wafer can be calculated as $0.1/0.65 \times 0.35 = 0.054$ W.

When the mirror temperature and the mirror absorption heat quantity are detected on the basis of a detection signal from a temperature sensor at a single location and if the lower surface temperature is 24° C. and the absorbed heat quantity is 0.4 W, the mirror temperature controller concludes that the lower surface temperature 23° C. is the temperature by which the change in surface shape of the mirror (where the linear expansion coefficient α of the mirror is the function a of the temperature T (° C.), that is, $\alpha(T) = -1.25(T-23)$ (ppb)) can be held within an allowable range (preferably, at minimum), by use of a numerical table having been prepared beforehand through measurements or simulations and having been memorized into the system. Then, the mirror temperature controller applies a corresponding signal to the Peltier device controller so that the mirror lower surface temperature becomes equal to 23° C.

With the operation of the mirror temperature controller such as described above, a change in shape of the irradiated surface of the mirror due to absorption of exposure light by the mirror can be suppressed very small.

With the structure of this embodiment, detecting the mirror temperature at a single location is sufficient. This leads to an advantage of extended freedom in designing the layout around the mirror.

Embodiment 3

Next, referring to FIG. 3, a cooling system of a third embodiment of the present invention, corresponding to a modified form of the above-described cooling systems, will be explained. Those portions not described below have a corresponding structure and operation as of the first embodiment.

Figure 3:
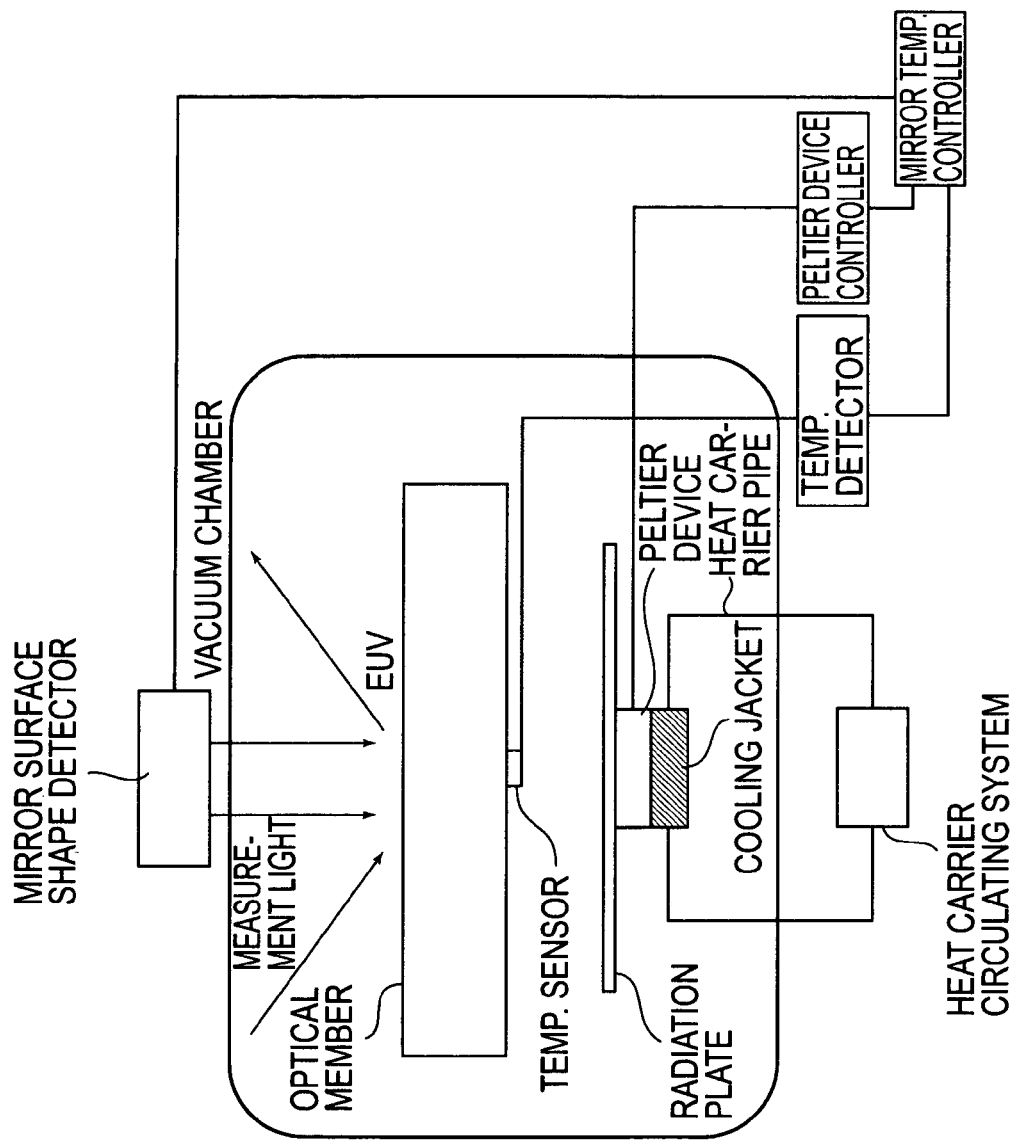
FIG. 3 is a schematic and diagrammatic view of a cooling system according to a third embodiment of the present invention.

As compared with the cooling system of the first embodiment (FIG. 1, the cooling system of FIG. 3 differs in that it is provided with a mirror surface shape detecting device for detecting the shape of the mirror surface. In a simple structure, the positions at two locations on the mirror surface may be detected. Due to thermal deformation caused by EUV absorption, the difference in position between these two locations on the mirror surface is changeable, and the mirror temperature controller applies a signal to the Peltier device controller so as to hold the change in positional difference at a level within an allowable range (preferably, at minimum).

With the operation of the mirror temperature controller such as described above, a change in shape of the irradiated surface of the mirror due to absorption of exposure light by the mirror can be suppressed very small.

As described above, a mirror whose linear expansion coefficient as the function α of the temperature T (° C.), that is, α(T)=−1.25(T−23) (ppb) is used, it is possible to suppress the thermal deformation of the mirror surface to a low level by changing the temperature at a single predetermined location on the mirror by use of a single radiation cooling plate. There is no necessity of using plural cooling mechanism to change temperatures at plural locations on the mirror.

In the first to third embodiments described above, the linear expansion coefficient α is expressed as a function of T (° C.), by:

$$\alpha(T)=-1.25(T-23)$$

This means that:

$$\alpha(T)=K(\text{baser material temperature minus 23})$$

where K is a coefficient that represents the amount of change of the linear expansion coefficient per one (1) degree.

In this example, K=−1.25. However, K may take any number as long as |K|<2.0 is satisfied. Preferably, |K|<1.5 may be satisfied.

The temperature whereat the linear expansion coefficient becomes equal to zero may be at any level. Preferably, however, it may be within a range of 20 to 25 deg. and, more preferably, in a range of 22 to 24 deg.

Furthermore, as regards the target temperature of the cooling-subject portion of the optical member (mirror), as compared with the temperature (23° C. in this case) whereat the linear expansion coefficient becomes equal to zero, the target temperature should desirably be within a range between a temperature lower by three degrees (i.e., 20° C.) to a temperature higher by two degrees (i.e., 25° C.). More preferably, it should be not lower than 21.5° C. and not higher than 23.5° C.

While the first to third embodiments have been described with reference to a cooling mechanism that suppresses the amount of deformation of a single optical member, in an optical instrument having a plurality of optical members it is an alternative to cause deformation of optical members so that changes in optical characteristics of them due to deformation are mutually cancelled with each other. Simply, even if deformation, greater than the allowable range, occurs at a concave mirror surface and a convex mirror surface, by adjusting the deformation amount, it is possible to suppress the influence upon the final optical characteristic (imaging performance) to a level in an allowable range.

Furthermore, since thermal deformation of an optical element (mirror) mainly affects the projection magnification, an optical element driving mechanism for adjusting the spacing between adjacent optical elements (mirrors) may desirably be provided, to thereby reduce the influence of thermal deformation upon the projection optical system.

With the arrangement of the projection optical system (or exposure apparatus) such as described above, and by adjusting the spacing between optical members on the basis of a detected temperature distribution of the optical member (mirror), the influence upon the final optical characteristic (imaging performance) of the projection optical system (or exposure apparatus) can be suppressed to a low level in an allowable range.

As regards the allowable level for the amount of deformation of the optical member, it may desirably be 0.3 nm and, more preferably, 0.1 nm.

Embodiment 4

Figure 7:
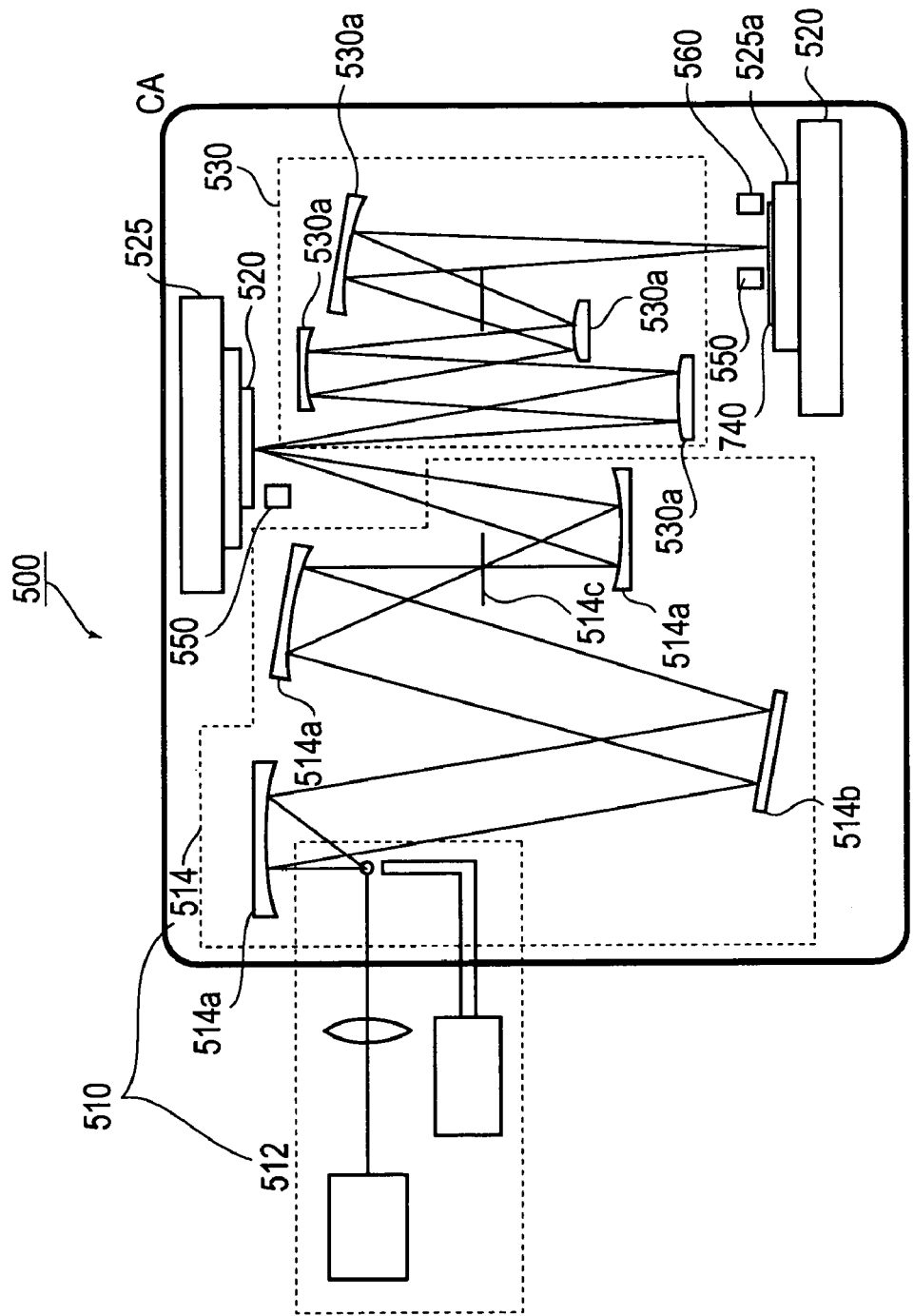
FIG. 7 is a schematic view of a general structure of an exposure apparatus according to a fourth embodiment of the present invention.

Referring now to FIG. 7, an embodiment of exposure apparatus 500 into which a cooling system 100 of the present invention is incorporated, will be described as a fourth embodiment. FIG. 7 is a schematic view of a general structure of the exposure apparatus 500.

The exposure apparatus 500 is a projection exposure apparatus wherein EUV light (e.g. wavelength 13.4 nm) is used as illumination light for exposure, and a circuit pattern formed on a mask 520 is projected and lithographically transferred to a workpiece 540 to be exposed, in accordance with a step-and scan method or step-and-repeat method, for example. This type of exposure apparatus is particularly suitably usable to lithographic process for submicron or quarter-micron order. In this embodiment, description will be made to an example of step-and-scan type exposure apparatus, called a scanner. Here, the step-and-scan method is an exposure method in which a wafer is continuously scanned (scanningly moved) relative to a mask so that a mask pattern is lithographically transferred to the wafer while, on the other hand, after completion of the exposure of one shot, the wafer is moved stepwise for exposure of a subsequent exposure region. On the other hand, the step-and-repeat method is an exposure method in which each time the simultaneous exposure of one shot is completed, the wafer is moved stepwise to a subsequent exposure region.

Referring to FIG. 7, the exposure apparatus 500 comprises an illumination system 510, a mask 520, a mask stage 525 for carrying the mask 520 thereon, a projection optical system 530, a workpiece 540 to be exposed, a wafer stage 545 for carrying the workpiece 540 thereon, an alignment detecting mechanism 550, and a focus position detecting mechanism 560.

As shown in FIG. 7, since EUV light has low transmissivity to atmosphere and contaminants are easily produced by reaction with residual gas component such as high molecular organic gas, for example, at least the light path along which the EUV light passes (that is, the whole optical system) is filled with a vacuum ambience VC.

The illumination system 510 is arranged to illuminate a mask 520 with EUV light (e.g. wavelength 13.4 nm) of arcuate shape defined with respect to an arcuate view field of the projection optical system 530. It includes an EUV light source 512 and an illumination optical system 514.

The EUV light source 412 comprises a laser plasma light source, for example. In the laser plasma light source, pulsed laser light of large intensity is projected on a target material placed inside a vacuum container, whereby a high-temperature plasma is produced. EUV light of a wavelength of 13 nm order, for example, emitted from the plasma is used. As regards the target material, metal film, gas jet or liquid drops may be used. In order to obtain improved average intensity of the emitted EUV light, the repetition frequency of the pulse laser should be high, and generally, the laser is operated at a repetition frequency of a few KHz.

The illumination optical system 512 comprises a condensing mirror 512a and an optical integrator 512b. The condensing mirror 512a serves to collect EUV light being approximately isotropically emitted from the laser plasma. The optical integrator 512b has a function for illuminating the mask 520 uniformly with a predetermined numerical aperture. Also, the illumination optical system 512 includes an aperture 512c disposed at a position optically conjugate with the mask 520, for restricting the illumination region on the mask into an arcuate shape.

A cooling system 1 and a cooling method 100 of the present invention can be applied to the condensing mirror 512a and the optical integrator 512b which are optical members constituting the illumination optical system 512. Through the cooling of the condensing mirror 512a and the optical integrator 512b by the cooling system 1, deformation due to thermal expansion can be prevented and superior imaging performance can be assured.

The mask 520 is a reflection type mask, and it has a circuit pattern (or image) formed thereon which pattern is going to be transferred. The mask is supported on and moved by a mask stage. Diffraction light produced from the mask 520 as illuminated is reflected by the projection optical system 530, and is projected on the workpiece 540 to be exposed. The mask 520 and the workpiece 540 are disposed in an optically conjugate relationship with each other. The exposure apparatus 500 in this embodiment is a step-and-scan type exposure apparatus, and by scanning the mask 520 and the workpiece 540, the pattern of the mask 520 is projected and transferred onto the workpiece 540 in a reduced scale.

The mask stage 525 supports the mask 520, and it is connected to a moving mechanism (not shown). Any structure well-known in the art may be applied to the mask stage 525. The moving mechanism not shown in the drawing comprises a linear motor, for example, and it drives the mask stage 525 at least in X direction, thereby to move the mask 520. The exposure apparatus 500 operates to scan the mask 520 and the workpiece 540 in synchronism with each other. Here, in a plane along the surface of the mask 520 or workpiece 540, the scan direction is taken as X, a direction perpendicular thereto is taken as Y, and a direction perpendicular to the surface of the mask 520 or workpiece 540 is taken as Z.

The projection optical system 530 includes a plurality of reflection mirrors (multilayered-film mirrors) 530a to project a pattern formed on the mask 520 surface onto the workpiece 540 (image plane) in a reduced scale. The number of mirrors 530a is four, in the illustrated example, but any number is used in a range of four to eight. Preferably, it may be an even number such as four, six or eight. In order to obtain a wide exposure region with a smaller number of mirrors, only a narrow arcuate region (ring field) spaced from the optical axis by a certain distance, may be used, while the mask 520 and the workpiece 540 are scanned simultaneously. This enables transfer of a wide area.

The numerical aperture (NA) of the projection optical system is about 0.2 to 0.3, and preferably, 0.25 to 0.3. The cooling system 1 and the cooling method 100 of the present invention can be applied to the mirrors 530a which are optical members constituting the projection optical system 530 and, in that occasion, deformation due to thermal expansion of the mirror can be prevented by cooling the mirrors 530a and superior imaging performance can be assured.

The workpiece 540 is a wafer, in this embodiment. However, it may be a liquid crystal base substrate or any other members to be processed. The workpiece 540 has a photoresist applied thereto.

The wafer stage 545 has a wafer chuck 545a to support the workpiece 540. The wafer stage 545 moves the workpiece by use of a linear motor, for example. The mask 520 and the workpiece 540 are scanned (moved) in synchronism with each other. Also, the position of the mask stage 535 and the position of the wafer stage 545 are monitored by means of a laser interferometer, for example, and they are driven at a constant speed ratio.

The alignment detecting mechanism 550 has a function for measuring the positional relation between the mask 520 position and the optical axis of the projection optical system 530, as well as the positional relation between the workpiece 540 position and the optical axis of the projection optical system 530. Also, it functions to set the positions and angles of the mask stage 525 and the wafer stage 545 so that a projected image of the mask 520 is registered with a predetermined position of the workpiece 540.

The focus position detecting mechanism 560 measures the focus position upon the workpiece 540 surface with respect to Z axis, and it controls the position and angle of the wafer stage 545 thereby to continuously hold the workpiece 540 surface at the imaging position of the projection optical system 530.

In exposure operation, the EUV light produced by the illumination device 510 illuminates the mask 520, and the pattern provided on the mask 520 surface is imaged upon the workpiece 540 surface. In this embodiment, the image plane has an arcuate shape (ring-like shape) and, by scanning the mask 520 and the workpiece 540 at a speed ratio corresponding to the reduction magnification ratio, the whole surface of the mask 520 is exposed.

A cooling system or cooling method such as described with reference to the first and second embodiment can be used for cooling the illumination system 510 (illumination optical system 514) of the exposure apparatus 500, or optical elements of the projection optical system 530, particularly, mirrors (reflective optical elements) thereof.

All the optical elements of the exposure apparatus may be cooled by the cooling system described with reference to the first and second embodiments or, alternatively, one or more of the optical elements provided in the exposure apparatus may be cooled.

It is desirable that a reticle used in this exposure apparatus is made of a material (as a base material) having a region in which the linear expansion coefficient becomes equal to zero at a temperature around 23° C. (preferably, 22–24° C.), as described in the first and second embodiments.

Embodiment 5

Next, referring to FIGS. 8 and 9, an embodiment of a device manufacturing method which uses an exposure apparatus 500 described above, will be explained as a fifth embodiment of the present invention.

Figure 8:
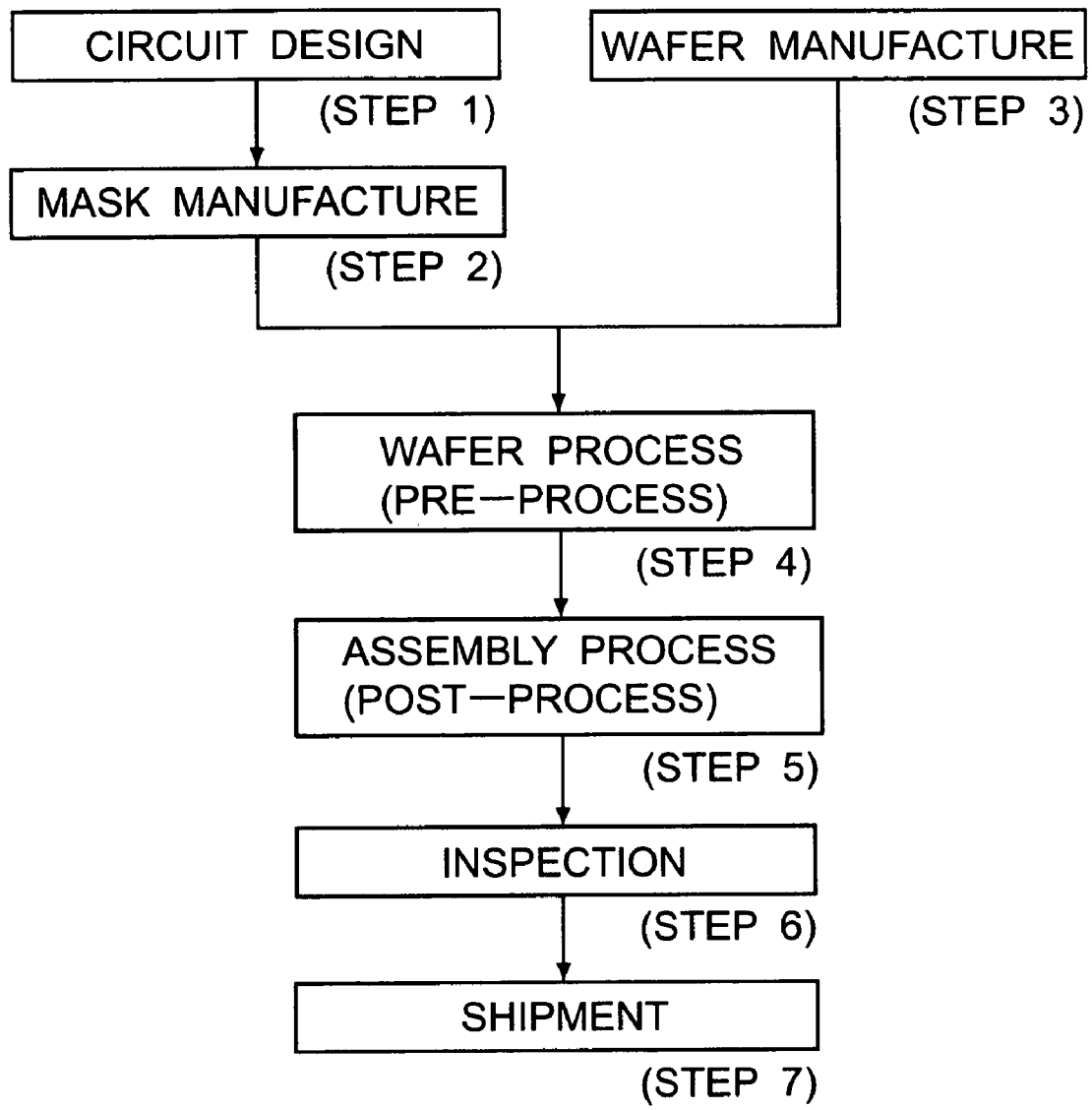
FIG. 8 is a flow chart for explaining manufacture of devices such as semiconductor chip (IC or LSI), LCD, or CCD, for example.

FIG. 8 is a flow chart for explaining the procedure of manufacturing various microdevices such as semiconductor chips (e.g., ICs or LSIs), liquid crystal panels, CCDS, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 9:
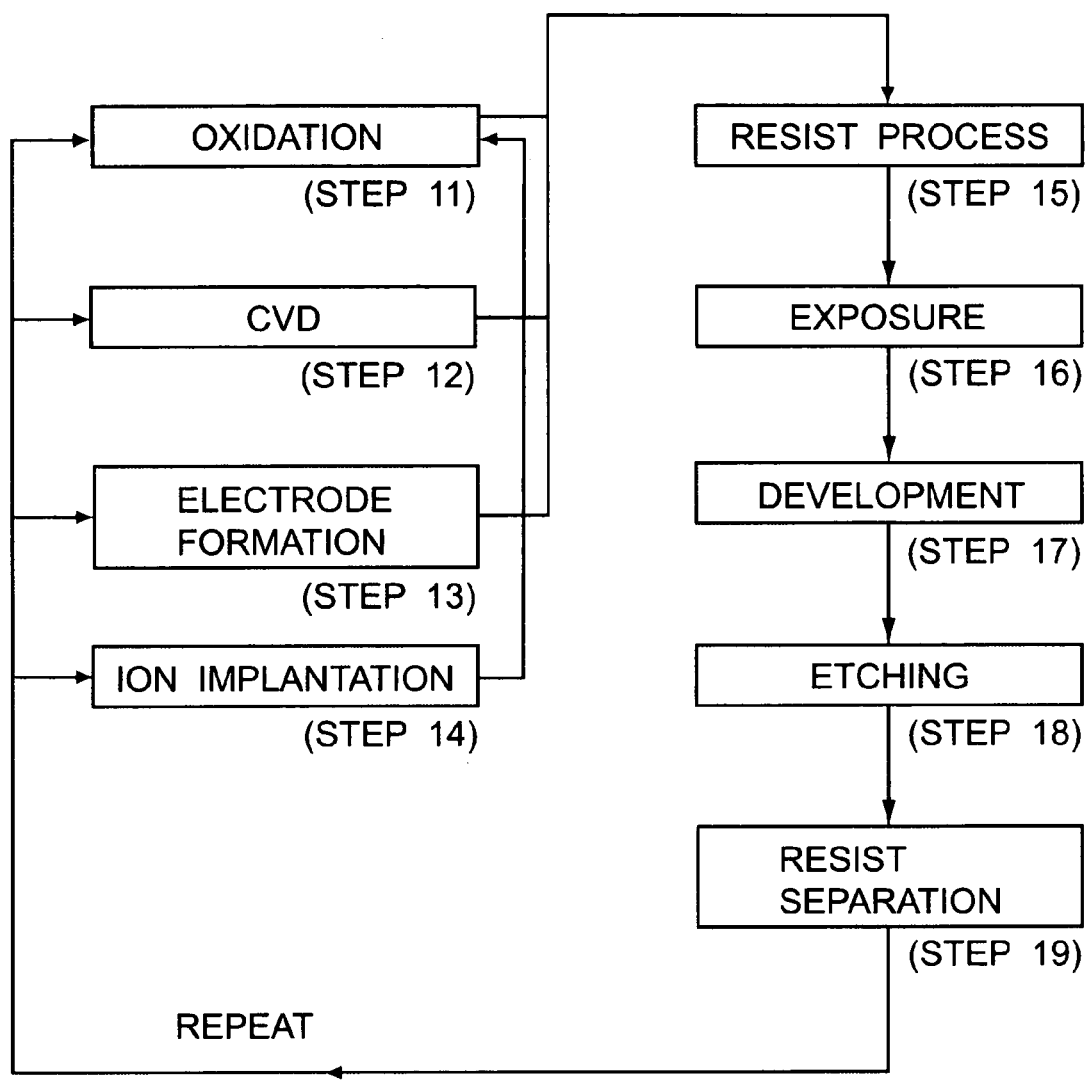
FIG. 9 is a flow chart for explaining details of a wafer process included at step 8 of FIG. 8.

FIG. 9 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured. As described, a device manufacturing method that uses an exposure apparatus as well as a device as a product thereof are also in the scope of the present invention.

Although several preferred embodiments of the present invention have been described, as a matter of course the invention is not limited to them. Variable changes and modifications are possible. For example, the cooling system and cooling method of the present invention can be applied to an optical member to be used with ultraviolet light, other than EUV light, and having a wavelength not longer than 200 nm such as ArF excimer laser or F2 laser, for example. Also, the invention is applicable also to a mask and a wafer.

In accordance with the cooling technology described above, even for an optical member disposed in a vacuum ambience, it is assured to cool the optical member without contact thereto and, also, to keep the thermal deformation of the mirror surface irradiated with exposure light within an allowable range. Therefore, deformation of the optical member due to thermal deformation thereof which causes degradation of the imaging performance can be reduced significantly, and desired optical performance can be assured.

The present invention can be embodied in various aspects, and examples are as follows.

(1) A cooling system for cooling an optical member including a material having a linear expansion coefficient that becomes equal to zero at a predetermined temperature, characterized by: a temperature detecting mechanism for detecting a temperature of a detection-subject portion of the optical member; a cooling mechanism for cooling a cooling-subject portion of the optical member; and a controller for controlling said cooling mechanism on the basis of the detection by said temperature detecting mechanism, so that an amount of deformation of a light incidence region of the optical member is held within an allowable range.

(2) A cooling system according to Item (1), further comprising deriving means for deriving a target temperature for the cooling-subject portion for keeping the amount of deformation of the light incidence region in the allowable range, wherein, in accordance with the target temperature derived by said deriving means, said cooling mechanism cools the cooling-subject portion.

(3) A cooling system according to Item (1) or (2), wherein said temperature detecting mechanism detects temperatures of cooling-subject portions at plural locations on the optical member, and it includes deriving means for deriving a target temperature for the cooling-subject portion for keeping the amount of deformation of the light incidence region in an allowable range on the basis of a difference in temperatures at the plural locations, and wherein, in accordance with the target temperature derived by said deriving means, said cooling mechanism cools the cooling-subject portion.

(4) A cooling system according to Item (1) or (2), further comprising an intensity detecting mechanism for detecting the intensity of light incident on the light incidence region, and deriving means for deriving a target temperature of the cooling-subject portion on the basis of the result of detection by said intensity detecting mechanism and of the result of detection by said temperature detecting mechanism, wherein, in accordance with the target temperature derived by said deriving means, said cooling mechanism cools the cooling-subject portion.

(5) A cooling system according to Item (1) or (2), further comprising a deformation measuring mechanism for measuring the amount of deformation at plural points on a light incidence plane, including the light incidence region, and deriving means for deriving a target temperature of the cooling-subject portion on the basis of the result of detection by said deformation measuring mechanism and of the result of detection by said temperature detecting mechanism, wherein, in accordance with the target temperature derived by said deriving means, said cooling mechanism cools the cooling-subject portion.

(6) A cooling system according to any one of Items (3)–(6), wherein such target temperature for the cooling-subject portion with which the amount of deformation of the optical member in the light incidence region becomes substantially smallest is derived.

(7) A cooling system according to any one of Items (1)–(6), wherein the optical member includes a material whose linear expansion coefficient becomes equal to zero at the predetermined temperature, and a multilayered film is formed on that material.

(8) A cooling system according to any one of Items (1)–(7), wherein the cooling-subject portion is substantially included in the detection-subject portion.

(9) A cooling system according to any one of Items (1)–(8), wherein the detection-subject portion and the cooling-subject portion are substantially at the same location.

(10) A cooling system for cooling an optical member including a material having a linear expansion coefficient that becomes equal to zero at a predetermined temperature, characterized by: a temperature detecting mechanism for detecting a temperature of a predetermined portion of the optical member; a cooling mechanism for cooling the predetermined portion of the optical member; deriving means for deriving a temperature of the predetermined portion which temperature is effective to minimize the amount of deformation of a light incidence region of the optical member, on the basis of the result of detection by said detecting means; and a controller for controlling said cooling mechanism so that the temperature to be detected by said detecting means becomes approximately registered with the temperature minimizing the deformation amount.

(11) A cooling system according to any one of Items (1)–(10), wherein said cooling mechanism is disposed at a position opposed to the optical member without contact to the optical member, and it performs radiation cooling of the optical member.

(12) A cooling system according to any one of Items (1)–(11), wherein said temperature detecting mechanism includes a temperature sensor disposed without contact to the optical member.

(13) A cooling system according to any one of Items (1)–(12), wherein the temperature at which the linear expansion coefficient becomes equal to zero is substantially equal to an environment temperature when the optical member is produced.

(14) A cooling system according to any one of Items (1)–(13), wherein the optical member is disposed in a vacuum ambience.

(15) A cooling system according to any one of Items (1)–(14), wherein the optical member is a reflection member.

(16) A cooling system according to any one of Items (1)–(15), wherein a base material of the optical member is a material having a linear expansion coefficient which becomes equal to zero at the predetermined temperature.

(17) A cooling system according to any one of Items (1)–(16), wherein the light incident on the light incidence region is EUV light.

(18) A cooling system for cooling an optical member including a material having a linear expansion coefficient that becomes equal to zero at a predetermined temperature, characterized by: a temperature detecting mechanism for detecting a temperature of a detection-subject portion of the optical member; and a cooling mechanism for cooling a cooling-subject portion of the optical member on the basis of the detection by said temperature detecting mechanism.

(19) A cooling system according to any one of Items (1)–(18), wherein said cooling system cools the optical member so that an average temperature of the optical member is maintained in a range of the predetermined temperature ±1 degree.

(20) A cooling system according to any one of Items (1)–(19), wherein said cooling system cools the optical member so that an average temperature of the optical member is maintained in a range of the predetermined temperature ±0.4 degree.

(21) A cooling system according to any one of Items (1)–(20), wherein the predetermined temperature is in a range of 23° C.±0.5° C.

(22) A cooling system according to any one of Items (1)–(21), wherein the predetermined temperature is in a range of 23° C.±0.1° C.

(23) A cooling system according to any one of Items (1)–(22), wherein said cooling system cools the optical member without contact thereto.

(24) An exposure apparatus characterized by: an illumination optical system for illuminating a reticle with light from a light source; a projection optical system for directing light from the reticle to a workpiece to be exposed; and a cooling system as recited in any one of Items (1)–(23), for cooling at least one optical element of said illumination optical system and/or said projection optical system.

(25) An exposure apparatus according to Item (24), wherein said exposure apparatus includes a plurality of optical elements, and further comprises a driving mechanism for adjusting a spacing of adjacent optical elements on the basis of the result of detection by said temperature detecting mechanism.

(26) An exposure apparatus according to Item (24), wherein said exposure apparatus includes a plurality of optical elements disposed along an optical axis, and further comprises a driving mechanism for moving at least one of the optical elements in the optical axis direction on the basis of the result of detection by said temperature detecting mechanism.

(27) A device manufacturing method including a process of exposing a workpiece by use of an exposure apparatus as recited in Item (26), and a process for developing the exposed workpiece.

(28) A cooling method for cooling an optical member including a material having a linear expansion coefficient that becomes equal to zero at a predetermined temperature, characterized by: a temperature detecting step for detecting a temperature of a detection-subject portion of the optical member; a deriving step for deriving a temperature for a cooling-subject portion for keeping the amount of deformation of a light incidence region of the optical member within an allowable range, on the basis of the temperatures detected by said temperature detecting step; and a cooling step for cooling the cooling-subject portion so that the temperature of the cooling-subject portion becomes equal to the temperature of the cooling-subject portion derived by said driving step.

(29) A cooling method to be used in a case wherein an optical member has a base material provided by a material whose linear expansion coefficient is changeable with temperature and becomes equal to zero at a predetermined temperature, and wherein the optical member absorbs light to cause temperature change, characterized by: a step of detecting a temperature distribution of the optical member; and a step of cooling the optical member so that a temperature of a predetermined portion of the optical member is registered with a predetermined value.

(30) A cooling method to be used in a case wherein an optical member has a base material provided by a material whose linear expansion coefficient is changeable with temperature and becomes equal to zero at a predetermined temperature, and wherein the optical member absorbs light to cause temperature change, characterized by: a step of detecting a shape of the optical member; and a step of cooling the optical member so that a temperature of a predetermined portion of the optical member is registered with a predetermined value.

(31) A cooling method to be used in a case wherein an optical member has a base material provided by a material whose linear expansion coefficient is changeable with temperature and becomes equal to zero at a predetermined temperature, and wherein the optical member absorbs light to cause temperature change, characterized by: a step of calculating an energy to be absorbed by the optical member; and a step of cooling the optical member so that a temperature of a predetermined portion of the optical member is registered with a predetermined value.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-340790 filed Sep. 30, 2003, for which is hereby incorporated by reference.

What is claimed is:

1. A cooling system comprising:
an optical member including a material having a linear expansion coefficient that becomes equal to zero at a predetermined temperature;
a temperature detecting unit for detecting a temperature of a detection-subject portion of the optical member;
a cooling unit for cooling a cooling-subject portion of the optical member;
a control unit for controlling said cooling unit on the basis of the detection by said temperature detecting unit; and
wherein said cooling unit cools the cooling-subject portion without contacting the optical member.

2. A cooling system according to claim 1, wherein the optical member has a plurality of detection-subject portions, wherein said temperature detecting unit detects temperature of the plurality of detection-subject portions of the optical member, and wherein said control unit controls said cooling unit on the basis of the temperatures of the plurality of detection-subject portions.

3. A cooling system according to claim 1, further comprising an intensity detecting unit for detecting an intensity of light incident or to be incident on the optical member, wherein said control unit controls said cooling unit on the basis of the detection by said intensity detecting unit.

4. A cooling system according to claim 1, further comprising a position detecting unit for detecting positions at plural points on the optical member, wherein said control unit control said cooling unit on the basis of the detection by said position detecting unit.

5. A cooling system according to claim 1, wherein the optical member has a multilayered film formed on said material.

6. A cooling system according to claim 1, wherein said cooling unit includes a radiation plate.

7. A cooling system according to claim 1, wherein said temperature detecting unit detects the temperature of the detection-subject portion without contact thereto.

8. A cooling system according to claim 1, wherein said optical member is disposed in a vacuum ambience.

9. A cooling system according to claim 1, wherein said optical member is a reflective optical element.

10. A cooling system according to claim 1, wherein said material is included in a base material of the optical member.

11. A cooling system according to claim 1, wherein the optical member is adapted to be used with extreme ultraviolet light.

12. An exposure apparatus, comprising
an optical system for exposing an object to a pattern of an original;
a temperature detecting unit for detecting a temperature of a detection-subject portion of an optical member of said optical system, the optical member including a material having a linear expansion coefficient that becomes equal to zero at a predetermined temperature;
a cooling unit for cooling a cooling-subject portion of the optical member;
a control unit for controlling said cooling unit on the basis of the detection by said temperature detecting unit; and
wherein said cooling unit cools the cooling-subject portion without contacting the optical member.

13. An apparatus according to claim 12, wherein said optical system includes a plurality of optical members, wherein said apparatus further comprises a driving system for adjusting a position of at least one of said plurality of optical members on the basis of the detection made by said temperature detecting unit.

14. A device manufacturing method, comprising the steps of:
exposing a substrate to a pattern of an original by use of an exposure apparatus; and
developing the exposed substrate,
wherein the exposure apparatus includes (i) an optical system for exposing an object to a pattern of an original, (ii) a temperature detecting unit for detecting a temperature of a detection-subject portion of an optical member of the optical system, the optical member including a material having a linear expansion coefficient that becomes equal to zero at a predetermined temperature, (iii) a cooling unit for cooling a cooling-subject portion of the optical member, and (iv) a control unit for controlling the cooling unit on the basis of the detection by the temperature detecting unit; and
wherein said cooling unit cools the cooling-subject portion without contacting the optical member.

15. A cooling comprising the steps of:
detecting a temperature of a detection-subject portion of an optical member, the optical member including a material having a linear expansion coefficient that becomes equal to zero at a predetermined temperature;
cooling a cooling-subject portion of the optical member on the basis of the detection at said detection step; and
wherein said cooling unit cools the cooling-subject portion without contacting the optical member.

* * * * *